United States Patent [19]
Pierrat

[11] Patent Number: 5,244,759
[45] Date of Patent: Sep. 14, 1993

[54] SINGLE-ALIGNMENT-LEVEL LITHOGRAPHIC TECHNIQUE FOR ACHIEVING SELF-ALIGNED FEATURES

[75] Inventor: Christophe Pierrat, Watchung, N.J.

[73] Assignee: AT&T Bell Laboratories, Murray Hill, N.J.

[21] Appl. No.: 943,978

[22] Filed: Sep. 11, 1992

Related U.S. Application Data

[63] Continuation of Ser. No. 661,761, Feb. 27, 1991, abandoned.

[51] Int. Cl.$^5$ .......................... G03F 7/26; G03F 9/00
[52] U.S. Cl. ........................................ 430/5; 430/296; 430/312; 430/316; 430/323; 430/396; 430/942
[58] Field of Search ................... 430/5, 22, 296, 312, 430/313, 316, 317, 318, 322, 323, 325, 328, 942, 396

[56] References Cited

U.S. PATENT DOCUMENTS

| | | | |
|---|---|---|---|
| 3,930,857 | 1/1976 | Bendz | 430/312 |
| 4,035,522 | 7/1977 | Hatzakis | 427/43 |
| 4,738,907 | 4/1988 | Shigetomi et al. | 430/5 |
| 4,751,170 | 6/1988 | Mimura et al. | 430/312 |
| 4,772,539 | 9/1988 | Gillespie | 430/296 |
| 4,985,374 | 1/1991 | Tsuji et al. | 430/312 |

FOREIGN PATENT DOCUMENTS

| | | |
|---|---|---|
| 0383534 | 2/1990 | European Pat. Off. |
| 61-292643 | 12/1986 | Japan |
| 2244349A | 9/1990 | United Kingdom |

OTHER PUBLICATIONS

Hinsberg, W. D. et al., "A Lithographic Analog of Color Photography: Self-Aligning Photolithography Using a Resist with Wavelength-Dependent Tone," *J. of Imaging Science*, vol. 33 (1989 Jul./Aug.) No. 4, Springfield, Va., pp. 129-135.
Flagello, D. et al., "A Single Expose Double Develop (SEDD) Process for Self-Aligned Lithographic Applications," 8226 *Microelectronic Engineering*, 9 (1989) May, pp. 47-52.
Colbran, W. V. et al., "Hitachi E-Beam Lithography Tools for Advanced Applications," *SPIE*, vol. 1496, 10th Annual Symposium on Microlithography, (1990).
Nitayama, A. et al., "New Phase Shifting Mask with Self-Aligned Phase Shifters for a Quarter Micron Lithography", *International Electron Device Meeting (IEDM) Technical Digest*, pp. 57-60 (3.3.1-3.3.4) Dec. 1989.
Levenson, M. D. et al., "Improved Resolution in Photolithography with a Phase-Shifting Mask," *IEEE Transactions on Electron Devices*, vol. ED-29, pp. 1828-1836 (1982).
Terasawa, T. et al., "0.3 um Optical Lithography Using Phase-Shifting Mask," *SPIE*, vol. 1088, Optical/Laser Microlithography 11 (1989), pp. 25-33.

*Primary Examiner*—Marion E. McCamish
*Assistant Examiner*—Kathleen Duda
*Attorney, Agent, or Firm*—David I. Caplan

[57] ABSTRACT

A phase-shifting lithographic mask is made by a procedure involving only a single patterned electron, ion, or photon bombardment of a resist layer. The bombardment is arranged to produce three regions in the resist containing mutually different bombardment doses per unit area, one of which is typically zero. These three regions are then used—in conjunction with separate wet development steps with two developers of different concentrations—in order to pattern the resist layer and to from an underlying double layer consisting of a patterned opaque layer located on a differently patterned transparent phase-shifting layer, the transparent phase-shifting layer being located on, or being part of, a transparent substrate.

17 Claims, 3 Drawing Sheets

SINGLE-ALIGNMENT-LEVEL LITHOGRAPHIC TECHNIQUE FOR ACHIEVING SELF-ALIGNED FEATURES

This application is a continuation of application Ser. No. 07/661,761, filed on Feb. 27, 1991 now abandoned.

TECHNICAL FIELD

This invention relates to optical lithography, as can be used for fabricating semiconductor integrated circuit and other devices, and more particularly to methods for making phase-shifting masks for use in optical systems for lithographically fabricating such devices. These masks are also called "reticles" particularly when used in optical systems having magnifications different from unity.

BACKGROUND OF THE INVENTION

FIG. 1 shows a typical optical lithographic fabrication system 100 for delineating features in a wafer (substrate) 120 or in one or more layers of material(s) (not shown) located on a top major surface of the wafer, typically a semiconductor wafer (substrate). More specifically, optical radiation from an optical source 106, such as a mercury lamp, propagates through an aperture in an opaque screen 105, an optical collimating lens 104, a mask or reticle 103, and an optical focusing lens 102. The optical radiation emanating from the reticle 103 is focused by the lens 102 onto a photoresist layer 101 located on the top major surface of the wafer 120 itself or, alternatively, on the layer(s) on the top surface of the wafer 120. Thus, the pattern of the reticle 103—that is, its pattern of transparent and opaque portions—is focused on the photoresist layer 101. Depending upon whether this photoresist is positive or negative, when it is subjected to a developing process, typically a wet developer, the material of the photoresist is removed or remains at and only at areas where the optical radiation was incident. Thus, the pattern of the mask is transferred to ("printed on") the photoresist layer 101, whereby this photoresist becomes patterned. Subsequent etching processes, such as wet etching or dry plasma etching, remove selected portions of the substrate or of the layer(s) of material(s) (not shown) located between the top major surface of the wafer and the bottom surface of the photoresist layer, or of both the substrate and the layer(s). Portions of the substrate or of the layer(s) of material thus are removed from the top surface of the wafer 120 at areas underlying where the photoresist layer 101 was removed by the developing process but not at areas underlying where the photoresist remains. Alternatively, subsequent ion implantation introduces ions into the substrate or into the layer(s) of material(s), or both, whereby ions are introduced only into those portions of the substrate or of the layer(s) of material(s) underlying where the photoresist was removed. Thus, an edge feature of the pattern of the mask 103 (with linear features multiplied by L2/L1) is transferred—as an edge of material or as an edge of an ion implanted region—to the wafer 120 or to the layer(s) of material(s) overlying the wafer 120, as is desired, for example, in the art of semiconductor integrated circuit fabrication.

In fabricating such circuits, it is desirable to have as many devices, such as transistors, per wafer. Hence it is desirable to have as small a transistor or other feature size as possible, such as the feature size of a metallization stripe—i.e., its width W—or of an aperture in an insulating layer which is to be filled with metal, in order to form electrical connections, for example, between one level of metallization and another. Thus, for example, if it is desired to print the corresponding isolated feature having a width equal to W on the photoresist layer 101, a feature having a width equal to C must be located on the mask (reticle) 103. According to geometric optics, if this feature of width equal to C is a simple aperture in an opaque layer, then the ratio W/C=m, where m=L2/L1, and where m is known as the lateral magnification. When diffraction effects become important, however, the edges of the image become fuzzy (lose their sharpness); hence the resolution of the mask features when focused on the photoresist layer deteriorates.

In a paper entitled "New Phase Shifting Mask with Self-Aligned Phase Shifters for a Quarter Micron Lithography" published in *International Electron Device Meeting (IEDM) Technical Digest*, pp. 57–60 (3.3.1–3.3.4) (December, 1989), A. Nitayama et al. taught the use of masks having transparent phase-shifting portions in an effort to achieve improved resolution—i.e., improved sharpness of the image of the mask features focused on the photoresist layer 101. More specifically, these masks contained suitably patterned transparent optical phase-shifting layers, i.e., layers having edges located at predetermined distances from the edges of the opaque portions of the mask. Each of these phase-shifting layers had a thickness t equal to $\lambda/2(n-1)$, where $\lambda$ is the wavelength of the optical radiation from the source 106 (FIG. 1) and n is the refractive index of the phase-shifting layers. Thus, as known in the art, these layers introduced phase shifts (delays) of $\pi$ radians in the optical radiation. By virtue of diffraction principles, the presence of these phase-shifting layers should produce the desired improved resolution. Such masks are called "phase-shifting" masks.

The mask structure described by A. Nitayama et al., op. cit., was manufactured by a single-alignment-level process involving a step of wet etching an opaque chromium layer located underneath a phase-shifting layer of PMMA which is resistant to the wet etching, whereby the etching of the chromium layer undercut the PMMA layer and formed a phase-shifting mask. However, the lateral etching of the chromium layer is difficult to control, so that the positioning of the edges of the chromium layer is likewise difficult to control. Yet this positioning of the edges of the opaque chromium must be carefully controlled in order to yield the desired improved resolution for the mask.

Moreover, the method taught by A. Nitayama et al. is not sufficiently versatile to make masks having arbitrary features, such as clustered line-space features or isolated apertures having relatively narrow-sized phase-shifting assist-slots. Clustered line-space features, as well as apertures having phase-shifting slots, can be made in accordance with the teachings in a paper by M. D. Levenson et al. entitled "Improved Resolution in Photolithography with a Phase-Shifting Mask," published in *IEEE Transactions on Electron Devices*, Vol. ED-29, pp. 1828–1836 (1982). The technique taught therein to make such mask devices, however, required two alignment steps (two-alignment-level method), and is therefore undesirable from the standpoints of accurate alignment and decreased throughput of the mask-making procedure (typically electron beam lithography).

Isolated apertures with phase-shifting assist-slots have been taught in a paper by T. Terasawa et al. entitled "0.3 μm Optical Lithography Using Phase-Shifting Mask," published in *SPIE*, Vol. 1088, Optical/Laser Microlithography II (1989), pp. 25-33, at FIG. 2. But that method also requires a two-level alignment and is therefore likewise undesirable.

Therefore, it would be desirable to have a more versatile and more controllable single-alignment-level method of manufacturing phase-shifting masks. More generally, it would be desirable to have a more versatile and more controllable single-alignment-level lithographic technique for achieving self-aligned features.

SUMMARY OF THE INVENTION

A single-alignment-level lithographic procedure for achieving self-aligned features—as, for example, in a phase-shifting mask (reticle)—in accordance with the invention comprises the steps of:

(a) introducing into first, second, and third regions of a resist layer mutually differing respective first, second, and third doses of radiation per unit area, the resist layer being located upon a first material layer, such as an opaque layer, which is located upon a second material layer, such as transparent dielectric layer, the first region being contiguous with and having a first common boundary with the second region, and the second region being contiguous with and having a second common boundary with the third region;

(b) subjecting the resist layer with a first developing procedure, whereby the first region, but not the second or third regions, of the resist is dissolved;

(c) etching the first material layer solely in a region thereof underlying the original first region of the resist layer;

(d) subjecting the resist layer to a second development procedure, whereby the second but not the third region of the resist layer is dissolved;

(e) etching a thickness of the second material layer solely in a region underlying the original first region of the resist layer, whereby the thickness of the second material layer is reduced thereat; and (f) etching the second layer in a region thereof underlying the original second region of the resist layer, whereby there are created an edge in the first layer and an edge in the second material layer that are respectively aligned with the second and first common boundaries, and hence are aligned with respect to each other.

The remaining third region of the resist layer can then be removed, if desired. The radiation used in step (a) can be electrons, photons, or ions.

In a specific embodiment (FIGS. 2-5) the resist layer is positive tone; the radiation is electrons; and the dose of radiation per unit area in the first region (15, FIG. 2) is greater than that in the second region (16, FIG. 2), the dose in the third region (14) being substantially zero. In another specific embodiment (FIGS. 6-9) the resist layer is negative tone; the radiation is electrons; and the dose of radiation per unit area in the third region (15, FIG. 6) is greater than that in the second region (16, FIG. 6), the dose in the first region (14) being substantially zero. In both these embodiments, typically the second development is performed with a more concentrated developing solution than is the first.

In either of these specific embodiments in accordance with the invention only a single resist layer, which has been subjected to different doses of radiation in different regions, is needed. The procedure of this invention can thus be used to form a phase-shifting mask which can then be used as the reticle 103 in the system 100 (FIG. 1) for fabricating integrated circuits or for other lithographic purposes. The features (edges) of this mask are determined by the contours of the boundaries between the first, second, and third regions of the resist layer, and in turn these features determine the pattern transferred to the photoresist layer 101 in the system 100 (FIG. 1).

BRIEF DESCRIPTION OF THE DRAWING(S)

This invention, together with its various features and advantages, can be readily understood from the following detailed description taken in conjunction with the accompanying drawing in which.

Only for the sake of clarity, none of the drawings is to scale.

DETAILED DESCRIPTION

Figure 1:
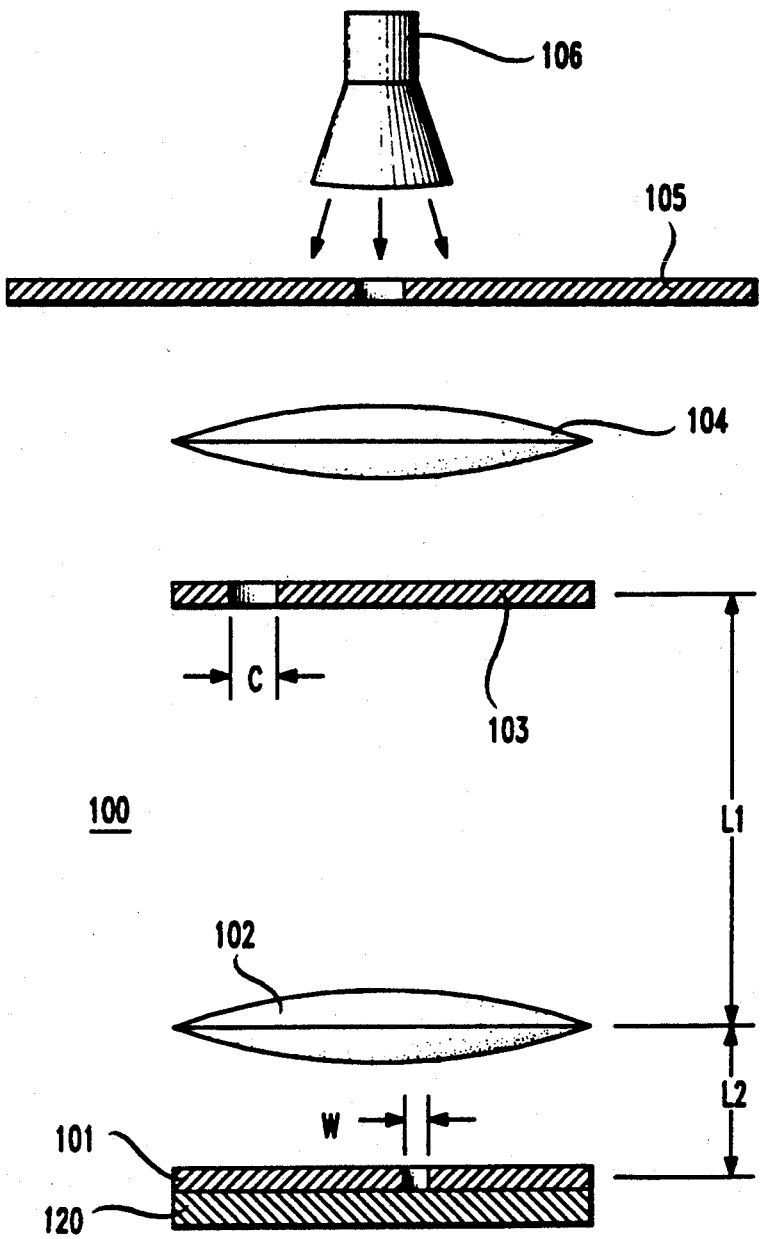
FIG. 1 is a diagram of a typical system, useful for understanding a purpose of the invention.
Figure 2:
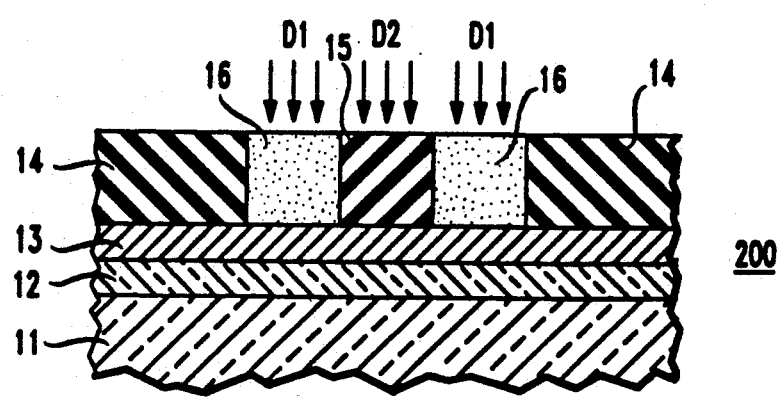
FIGS. 2-5 are side elevational views in cross section showing various stages in the manufacture of a phase-shifting mask, in accordance with a specific embodiment of the invention.
Figure 5:
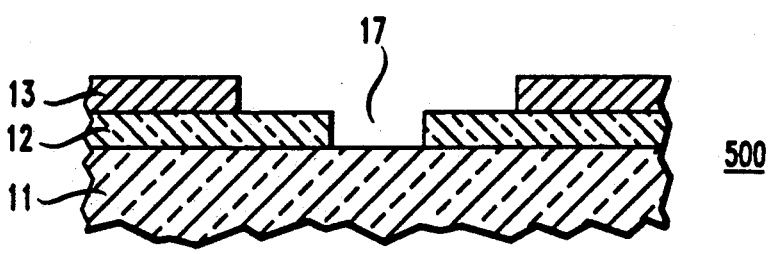

Referring now to the drawings, FIG. 2 shows an early device stage 200 in the making of an illustrative portion of a desired phase-shifting mask 500 (FIG. 5) for use as the reticle 103 in the system 100 (FIG. 1) in accordance with a specific embodiment of the invention. For the sake of definiteness, it will be assumed that the desired feature in this portion of the mask is a square aperture, but it should be understood that other features can be made in accordance with the invention, such as a circular aperture or a line-space feature, by modifying the contours of the various regions to be formed in the resist layer described below, whereby such features as clustered line-space features can be attained.

Substrate 11 is a dielectric, typically uniformly thick amorphous quartz. In any event, it is transparent to the wavelength λ to be used in the system 100 (FIG. 1). Layer 12 is a transparent (to the wavelength λ) phase-shifting layer, e.g., uniformly thick spun-on glass, located on a major surface of the quartz substrate 11 itself. Alternatively, the layer 12 can be omitted.

For phase-shifting by $\pi$ radians, the thickness of the phase-shifting layer 12 is everywhere equal to $\lambda/2(n-1)$, where λ is the vacuum wavelength to be used in the system 100 (FIG. 1) and n is the refractive index of the material in the layer 12. In case this layer 12 is omitted, then the depth of the trench 17 resulting in the substrate 11, instead of in the layer 12, is also equal to $\lambda/2(n-1)$ but where n is refractive index in the substrate 11. Note that in case the source 106 (FIG. 1) emits unwanted wavelength(s), suitable optical filtering can be deployed in the system 100, in order to assure essentially monochromatic radiation, as known in the art.

Layer 13 is an opaque layer, typically chromium having a uniform thickness of 0.1 μm which has been deposited on the top major surface of the phase-shifting layer 12 or in the absence of this layer 12 directly on the top major surface of the substrate 11.

Region 14 is a portion of a uniformly thick positive tone resist layer, typically a polymer such as polycresolformaldehyde sensitized with substituted 1,2 napthoquinone diazide, having a uniform thickness of 0.5 μm. Such a resist is supplied by the Shipley Company under the trademark of MP2400. The resist layer is bombarded with electrons in the amount of doses D2 and D1 of electrons in regions 15 and 16, respectively. The dose D2 is greater than D1. For example, D2 is about 20 micro-coulombs per square centimeter, and the dose D1 is about 10 micro-coulombs per square centimeter, both doses at 20 keV. Typically, the outer contours of the region 15 form a square, and the contours of the region 16 form a square ring, but other contours are feasible as noted above.

Figure 3:
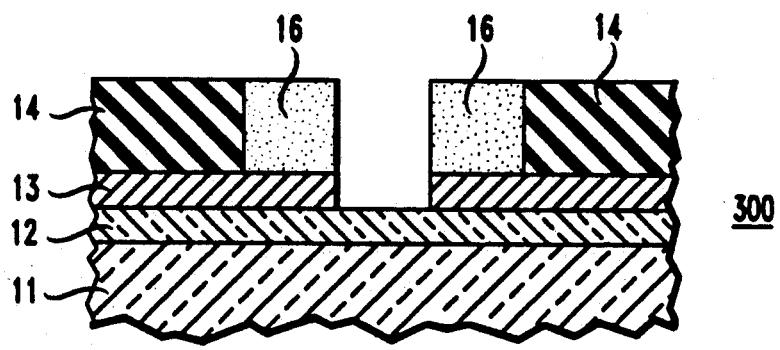

After the electron bombardment, the resist is developed in a suitable developer which removes the region 15 of the resist but not region 14 or 16. For example, AZ2401 developer (Shipley) diluted in water, in a dilution of 1 volume of developer in 5 volumes of water, can be used for about 8 minutes. Then the portion of the chromium layer 13 underlying the (removed) original resist region 15 is etched, typically by means of wet etching with ceric ammonium nitrate solution or dry etching with a chlorinated gaseous plasma. At this point of the process, device stage 300 (FIG. 3) is attained.

Figure 4:
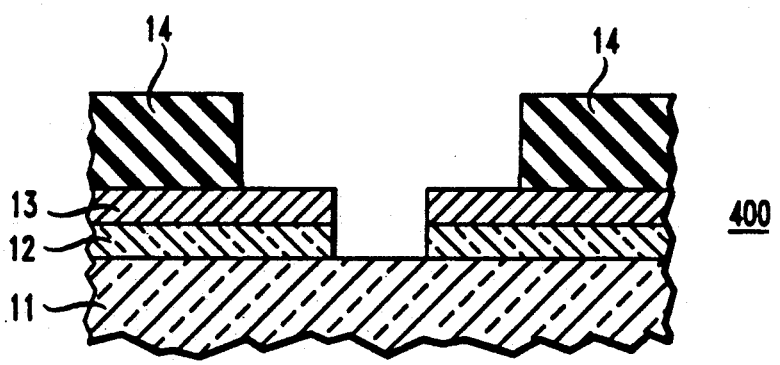

Next, the resist is further developed, this time in a suitable—typically more concentrated developer which removes the resist region 16, but again not the resist region 14. For example, AZ2401 developer supplied by Shipley, in a dilution of 1 volume of developer in 4 volumes of water, can be used for about 5 minutes. Then the spun-on glass layer 12 is etched down to its interface with the quartz substrate 11; or, in the absence of the layer 12, the quartz substrate is etched—for example, either with a wet etching solution of buffered hydrofluoric acid in water or with a dry $CHF_3$ plasma. At this point of this process, stage 400 (FIG. 4) is attained.

Next, the exposed portion of the chromium layer—viz. the portion underlying the (removed) original resist region 16—is etched by means of wet or dry etching. Finally, the remaining resist region 14 is removed, typically by means of a suitable wet etching with a wet organic solvent or an acid solution, or a dry etching with an $O_2$ plasma, whereby the desired phase-shifting mask 500 (FIG. 5) is obtained.

Note that the etching of layer 12 (or substrate 11) can be performed just prior to the removal of the resist region 16 especially if the etching of layer 12 (or substrate 11) is a wet etching process, since such a process usually does not modify the resist region 16. To remove any unwanted residues, if need be, an oxygen plasma treatment can be added after any etching step or any developing step.

Figure 6:
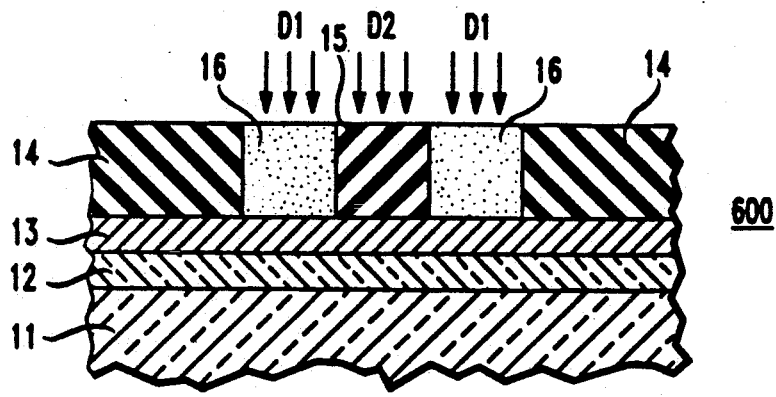
FIGS. 6-9 are side elevational views in cross section showing various stages in the manufacture of a phase-shifting mask, in accordance with another specific embodiment of the invention.
Figure 9:
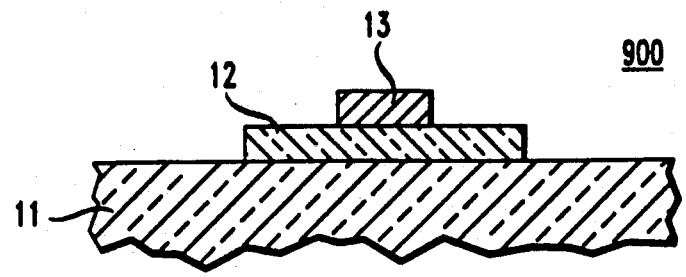

Referring now to FIG. 6, an early stage 600 in the making of an illustrative portion of a desired phase-shifting mask 900 (FIG. 9) for use as the reticle 103 in the system 100 (FIG. 1) in accordance with another specific embodiment of the invention. Here in FIG. 6, all elements are the same as in FIG. 2 and are given the same reference numerals, except that the resist material in the stage 600 is negative tone. This resist material can be, for example, an SAL601 resist, as supplied by Shipley, uniformly 0.5 μm thick, baked on a hot plate at 70° C. for 4 minutes. The resist layer is bombarded in regions 15, 16, and 14 with electron doses D2, D1, and substantially zero, respectively. Typically, D2 is equal to approximately 7 micro-coulombs per square centimeter, D1 is approximately equal to 4 micro-coulombs per square centimeter, and all the electrons have been accelerated to approximately 20 keV.

Figure 7:
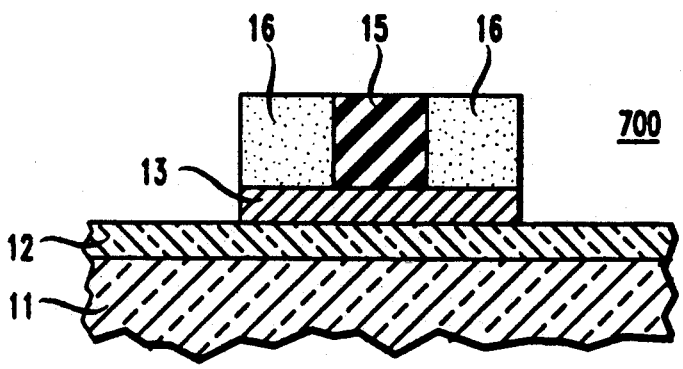

After the electron bombardment, the resist is developed, typically for 4 minutes with a wet developer such as an 0.27N aqueous solution of tetramethylammonium hydroxide. In this way, resist region 14, but not region 15 or 16, is removed. To remove undesired residues if need be, an oxygen plasma treatment can be used. Then the portion of the chromium layer 13 underlying the (removed) original resist region 14 is dry or wet etched. For example, a wet etching with ceric ammonium nitrate solution can be used for this purpose. At this point of the process, device stage 700 (FIG. 7) is attained.

Figure 8:
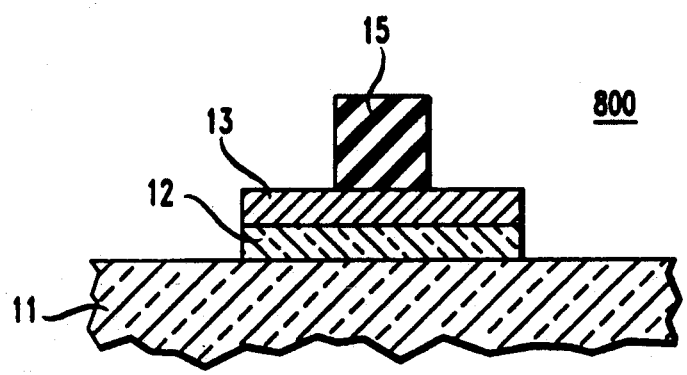

Next, the resist is further developed by means of a more concentrated developing solution, typically by means of an aqueous 0.54N solution of tetramethylammonium hydroxide for 4 minutes. Again, as above, an oxygen plasma can be used to remove unwanted residues. Then the spun-on glass layer 12, or in its absence the quartz substrate 11, is etched. For example, (in the absence of the spun-on glass layer 12) the quartz substrate 11 is dry etched for 9 minutes by means of a $CHF_3$ plasma at about 100 sccm, 2.7 Pa, 200 Watt, in a Plasma Therm SL720 etching chamber. In this way, the exposed portions of the quartz substrate 11 are etched to a depth of 385 nm. Unwanted residues can then be removed by an oxygen plasma treatment. At this point, the device stage 800 (FIG. 8) is attained.

Next, the chromium layer 12 is etched again, typically by means of a treatment with a ceric ammonium nitrate solution, whereby only the portions of the chromium layer 13 underlying the resist region 15 remain, whereas the portions of the chromium layer 13 underlying the (by now removed) original resist regions 14 and 16 have been removed. Finally, the resist region 15 is removed, as by means of a plasma treatment. At this point, the desired phase-shifting mask 900 (FIG. 9) is attained, which can be used as the reticle 103 in the system 100 (FIG. 1).

Note that the above-mentioned oxygen plasma treatments to remove unwanted residues (if any) are not mandatory but are optional.

Although the invention has been described in terms of specific embodiments, various modifications can be made without departing from the scope of the invention. Instead of chromium for the opaque layer 13, other sufficiently opaque materials such as molybdenum silicide can be used. The spun-on glass layer 12, as noted above, can be omitted or can be replaced with other materials that can be selectively etched with respect to—i.e., have higher etch rates than—the underlying (quartz) substrate, such as silicon dioxide which has been chemically vapor deposited on the substrate. Moreover, thicknesses of the phase-shifting layer corresponding to phase-shifts other than $\pi$ radian can also be used, in accordance with diffraction principles. Finally, the relative sizing of the resist regions 15 and 16 advantageously are made in accordance with criteria set forth in the pending U.S. patent application entitled "Phase-Shifting Lithographic Masks With Improved Resolution," Ser. No. 07/622,680, filed on Dec. 5, 1990.

I claim:

1. A lithographic technique for making a phase-shifting mask including the steps of:
    (a) introducing into first, second, and third regions of a resist layer mutually differing first, second, and third doses of resist-modifying radiation per unit area, respectively, the resist layer being located upon a first material layer which is located upon a second material layer, the first region being contiguous with and having a first common boundary with the second region, and the second region being contiguous with and having a second common boundary with the first region, the first material layer being optically absorbing and the second material layer being transparent with respect to prescribed optical radiation;

(b) subjecting the resist layer to a first development procedure, whereby the first region, but not the second or third regions, of the resist layer is dissolved;

(c) etching the first material layer, but not the second material layer, solely in a region thereof underlying the original first region of the resist layer;

(d) subjecting the resist layer to a second development procedure, whereby the second but not the third region of the resist layer is dissolved;

(e) etching a thickness of the second material layer solely in a region underlying the original first region of the resist layer, whereby the thickness of the second material layer is reduced thereat; and (f) etching the first material layer in a region thereof underlying the original second region of the resist layer, wherein the order of sequence of the steps is (a), (b), (c), (d), (e), (f), whereby there are created an edge in the first material layer and an edge in the second material layer that are aligned with the second and first common boundaries, respectively.

2. The technique of claim 1 in which the third dose is essentially zero, the resist is a positive tone resist, and the first dose of radiation per unit area is greater than the second.

3. The technique of claim 2 in which the radiation is essentially electrons.

4. The techniques of claim 3 in which the etching recited in step (e) is dry etching.

5. The technique of claim 2 in which the etching recited in step (e) is dry etching.

6. The technique of claim 1 in which the first dose is essentially zero, the resist is a negative tone resist, and the third dose of radiation per unit area is greater than the second.

7. The technique of claim 4 in which the radiation is essentially electrons.

8. The technique of claim 1 in which the second material layer is located on a substrate composed of a third material, and in which the entire thickness of the second material layer underlying the original first region of the resist layer is removed during step (e).

9. A photolithographic method including the steps of:
(a) forming a phase-shifting mask in accordance with the steps recited in claim 1;
(b) directing the prescribed optical radiation onto and through the mask, and focusing the optical radiation propagating through the mask onto a photoresist layer located on a major surface of a wafer, or located on a layer of material located on a major surface of a wafer, in which the device is to be fabricated;
(c) developing the photoresist, whereby a patterned photoresist layer is formed having an edge feature therein; and
(d) defining a feature at the major surface of the wafer or in the layer of material, in accordance with the edge feature of the patterned photoresist layer.

10. A photolithographic method including the steps of:
(a) forming a phase-shifting mask in accordance with the steps recited in claim 1, in which the third dose is substantially zero, the resist is a positive tone resist, and the first dose of the resist-modifying radiation per unit area is greater than the second;
(b) directing the prescribed optical radiation onto and through the mask, and focusing the optical radiation propagating through the mask onto a photoresist layer located on a major surface of a wafer, or located on a layer of material located on a major surface of wafer;
(c) developing the photoresist layer, whereby a patterned photoresist layer is formed having an edge feature therein; and
(d) defining a feature at the major surface of the wafer or in the layer of material, in accordance with the edge feature of the patterned photoresist layer.

11. A photolithographic method including the steps of:
(a) forming a phase-shifting mask in accordance with the steps recited in claim 1, in which the radiation is essentially electrons and in which the third dose is substantially zero, the resist is a positive tone resist, and the first dose of the resist-modifying radiation per unit area is greater than the second;
(b) directing the prescribed optical radiation onto and through the mask, and focusing the optical radiation propagating through the mask onto a photoresist layer located on a major surface of a wafer, or located on a layer of material located on a major surface of wafer;
(c) developing the photoresist layer, whereby a patterned photoresist layer is formed having an edge feature therein; and
(d) defining a feature at the major surface of the wafer or in the layer of material, in accordance with the edge feature of the patterned photoresist layer.

12. A photolithographic method of fabricating a semiconductor integrated circuit device including the steps of:
(a) forming a phase-shifting mask in accordance with the steps recited in claim 1;
(b) directing the prescribed optical radiation onto and through the phase-shifting mask, and focusing the optical radiation propagating through the mask onto a photoresist layer located on a major surface of a semiconductor wafer, or located on a layer of material located on a major surface of a semiconductor wafer, in which the device is to be fabricated;
(c) developing the photoresist layer, whereby a patterned photoresist layer is formed having an edge feature therein; and
(d) defining a feature at the major surface of the wafer or in the layer of material, in accordance with the edge feature of the patterned photoresist layer.

13. A photolithographic method of fabricating a semiconductor integrated circuit device including the steps of:
(a) forming a phase-shifting mask in accordance with the steps recited in claim 1, in which the third dose is substantially zero, the resist is a positive tone resist, and the first dose of the resist-modifying radiation per unit area is greater than the second;
(b) directing the prescribed optical radiation onto and through the mask, and focusing the optical radiation propagating through the mask onto a photoresist layer located on a major surface of a semiconductor wafer, or located on a layer of material located on a major surface of a semiconductor wafer, in which the semiconductor integrated circuit device is to be fabricated;
(c) developing the photoresist layer, whereby a patterned photoresist layer is formed having an edge feature therein; and
(d) defining a feature at the major surface of the wafer or in the layer of material, in accordance with the edge feature of the patterned photoresist layer.

14. A photolithographic method of fabricating a semiconductor integrated circuit including the steps of:
(a) forming a phase-shifting mask in accordance with the steps recited in claim 1, in which the radiation is essentially electrons and in which the third dose is substantially zero, the resist is a positive tone resist, and the first dose of the resist-modifying radiation per unit area is greater than the second;
(b) directing the prescribed optical radiation onto and through the mask, and focusing the optical radiation propagating through the mask onto a photoresist layer located on a major surface of a semiconductor wafer, or located on a layer of material located on a major surface of a semiconductor wafer, in which the semiconductor integrated circuit device is to be fabricated;
(c) developing the photoresist layer, whereby a patterned photoresist layer is formed having an edge feature therein; and
(d) defining a feature at the major surface of the wafer or in the layer of material, in accordance with the edge feature of the patterned photoresist layer.

15. A photolithographic method of fabricating a semiconductor integrated circuit device including the steps of:
(a) forming a phase-shifting mask in accordance with the steps recited in claim 1, in which the first dose is substantially zero, the resist is a negative tone resist, and the third dose of the resist-modifying radiation per unit area is greater than the second;
(b) directing the prescribed optical radiation onto and through the mask, and focusing the optical radiation propagating through the mask onto a photoresist layer located on a major surface of a semiconductor wafer, or located on a layer of material located on a major surface of a semiconductor wafer, in which the semiconductor integrated circuit is to be fabricated;
(c) developing the photoresist layer, whereby a patterned photoresist layer is formed having an edge feature therein; and
(d) defining a feature at the major surface of the wafer or in the layer of material, in accordance with the edge feature of the patterned photoresist layer.

16. A photolithographic method of fabricating a semiconductor integrated device including the steps of:
(a) forming a phase-shifting lithographic mask in accordance with the steps recited in claim 1, in which the radiation is essentially electrons and in which the first dose is substantially zero, the resist is a negative tone resist, and the third dose of the resist-modifying radiation per unit area is greater than the second;
(b) directing the prescribed optical radiation onto and through the mask, and focusing the optical radiation propagating through the mask onto a photoresist layer located on a major surface of a semiconductor wafer, or located on a layer of material located on a major surface of a semiconductor wafer, in which the semiconductor integrated circuit device is to be fabricated;
(c) developing the photoresist layer, whereby a patterned photoresist layer is formed having an edge feature therein; and
(d) defining a feature at the major surface of the wafer or in the layer of material, in accordance with the edge feature of the patterned photoresist layer.

17. The technique of claim 1 in which the etching recited in step (e) is dry etching.

* * * * *